United States Patent
Weng

(10) Patent No.: US 8,552,450 B2
(45) Date of Patent: *Oct. 8, 2013

(54) LED PACKAGE STRUCTURE WITH A FUSE FOR PROTECTION FROM HIGH CURRENT

(75) Inventor: Ssu-Yuan Weng, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/192,988

(22) Filed: Jul. 28, 2011

(65) Prior Publication Data

US 2011/0278639 A1    Nov. 17, 2011

Related U.S. Application Data

(63) Continuation of application No. 12/540,380, filed on Aug. 13, 2009, now Pat. No. 8,222,665.

(30) Foreign Application Priority Data

May 27, 2009    (TW) ................... 98117650 A

(51) Int. Cl.
  *H01L 33/00*    (2010.01)
(52) U.S. Cl.
  USPC ..................... 257/98; 257/E33.066
(58) Field of Classification Search
  USPC ............ 257/98–100, 209, 528, 529, 665; 438/132, 215, 281, 333, 467, 601
  See application file for complete search history.

(56) References Cited

U.S. PATENT DOCUMENTS

| | | | |
|---|---|---|---|
| 4,157,486 A | 6/1979 | Fegley | |
| 5,530,318 A | 6/1996 | Ensign, Jr. et al. | |
| 6,259,170 B1 | 7/2001 | Limoge et al. | |
| 6,310,364 B1 | 10/2001 | Uemura | |
| 8,222,665 B2 * | 7/2012 | Weng | 257/99 |
| 2003/0098651 A1 | 5/2003 | Lin et al. | |
| 2004/0257191 A1* | 12/2004 | Muller | 337/159 |
| 2006/0197646 A1 | 9/2006 | Suzuki | |
| 2008/0007885 A1 | 1/2008 | Mehrl et al. | |
| 2010/0127247 A1 | 5/2010 | Yang et al. | |

FOREIGN PATENT DOCUMENTS

| | | |
|---|---|---|
| CN | 1447634 A | 10/2003 |
| CN | 1549291 | 11/2004 |
| CN | 101197351 | 6/2008 |
| JP | 08-321578 | 12/1996 |
| JP | 08-321578 A * | 12/1996 |
| JP | 9199761 | 7/1997 |
| JP | 2006-128277 | 5/2008 |
| TW | M321525 | 11/2007 |
| TW | M354294 | 4/2009 |
| TW | 2009152 | 5/2009 |

OTHER PUBLICATIONS

Machine translation for the JP08-321578 A has been attached.*
USPTO, Final Office Action in U.S. Appl. No. 12/540,380, filed Feb. 2, 2012, pp. 2-5.

* cited by examiner

*Primary Examiner* — Bilkis Jahan
(74) *Attorney, Agent, or Firm* — Han IP Corporation

(57) ABSTRACT

An LED package structure comprises an LED chip and a fuse electrically connected to the LED chip in series. The fuse has a low melting point such that the fuse melts under a high current to form an open circuit to prevent the high current from flowing through the LED chip.

12 Claims, 6 Drawing Sheets

LED PACKAGE STRUCTURE WITH A FUSE FOR PROTECTION FROM HIGH CURRENT

CROSS-REFERENCE TO RELATED PATENT APPLICATIONS

This application claims priority to U.S. patent application Ser. No. 12/540,380, filed on Aug. 13, 2009, which claims priority to Taiwan Patent Application Number 098117650, filed on May 27, 2009. These patent applications are herein incorporated in their entirety by reference.

BACKGROUND

1. Technical Field

The present disclosure relates to a light emitting diode (LED) package structure, and more particularly, to an LED package structure with a fuse.

2. Description of Related Art

Since an LED possesses advantages of long lifetime, small size, shock-proof property, low heat emission and low electric power consumption, LEDs have been widely used as indicative lamps or light sources for various household appliances and instruments. LEDs are even used in various types of mobile electronic products or large-sized array-type LED products such as car electronic products, wireless communication products, traffic signal system and outdoor bulletin boards.

LED chips are typically current-driven, and thus a stable current flow should be supplied to the LED chips as a power source, such that the LED chips can emit stable illumination lights. In the past, most of the LED chips are low power LED chips, which require low driving current to provide light. Nevertheless, the high illumination and high power applications of LED have gradually become trendy. In addition, most circuit systems now require and drive a plurality of LED chips electrically connected in series or in parallel, instead of a single LED chip. In view of the above, a circuit system has to supply higher current to drive the LED chips than before. It should be noted that when the driving current increases, the probability of short circuit increases as well. Particularly, as the power source is normally a voltage source and as the impedance of each of the LEDs may be substantially different, the current may become unstable. For this reason, when the current inside the circuit system becomes extremely high, the LED chips may be damaged or burned down. Therefore, prevention of damage to LED chips due to increase of input current and increasing the circuit protection of LED package structure are critical issues.

SUMMARY

One objective of the present disclosure is to provide an LED package structure to protect the LED chip and the circuit system electrically connected to the LED chip from damage.

In one aspect, an LED package structure may comprise an LED chip and a fuse electrically connected to the LED chip in series. The fuse may have a low melting point such that the fuse melts under a high current to form an open circuit to prevent the high current from flowing through the LED chip.

In one embodiment, the fuse may comprise a chip fuse. The chip fuse may comprise a substrate, a first electrode, a second electrode, and a metal conductive pad, the metal conductive pad melting under the high current to prevent the high current from flowing through the LED chip.

The LED package structure may further comprise a lead frame having a first lead pin, a second lead pin, and a loading part connected to the first lead pin.

In one embodiment, the LED chip may be disposed on the loading part of the lead frame, and the fuse may be disposed on the first lead pin of the lead frame.

In another embodiment, the LED chip may be disposed on the loading part of the lead frame, and the fuse may be disposed on the second lead pin of the lead frame.

In still another embodiment, the LED chip may be disposed on the loading part of the lead frame, and the fuse may be disposed on the loading part of the lead frame.

The LED package structure may further comprise a plurality of metal conductive wires that electrically connect the LED chip and the fuse in series between the first lead pin and the second lead pin of the lead frame. The metal conductive wires may comprise metal conductive wires made of gold.

Alternatively or additionally, the LED package structure may further comprise an encapsulation surrounding the LED chip and the fuse, and covering a part but not all of the lead frame.

In another aspect, an LED package structure may comprise a lead frame having a first lead pin, a second lead pin, and a loading part connected to the first lead pin. The LED package structure may also comprise an LED chip disposed on the lead frame, and a fuse disposed on the lead frame. The fuse may be electrically connected to the LED chip in series between the first lead pin and the second lead pin of the lead frame.

In one embodiment, the LED chip may be disposed on the loading part of the lead frame, and the fuse may be disposed on the first lead pin of the lead frame.

In another embodiment, the LED chip may be disposed on the loading part of the lead frame, and the fuse may be disposed on the second lead pin of the lead frame.

In yet another embodiment, the LED chip may be disposed on the loading part of the lead frame, and the fuse may be disposed on the loading part of the lead frame.

In one embodiment, the fuse may comprise a chip fuse. The chip fuse may comprise a substrate, a first electrode, a second electrode, and a metal conductive pad with a low melting point. The metal conductive pad may melt under a high current to form an open circuit to prevent the high current from flowing through the LED chip.

The LED package structure may further comprise a plurality of metal conductive wires that electrically connect the LED chip and the fuse in series between the first lead pin and the second lead pin of the lead frame.

Alternatively or additionally, the LED package structure may further comprise an encapsulation covering the LED chip, the fuse, and at least a part of the lead frame. The encapsulation may comprise epoxy, silicone, polyamide, or any combination thereof.

These and other objectives of the present disclosure will become apparent to those of ordinary skill in the art after reading the following detailed description of the preferred embodiments that are illustrated in the various figures and drawings.

DETAILED DESCRIPTION OF THE PREFERRED EMBODIMENTS

Figure 1:
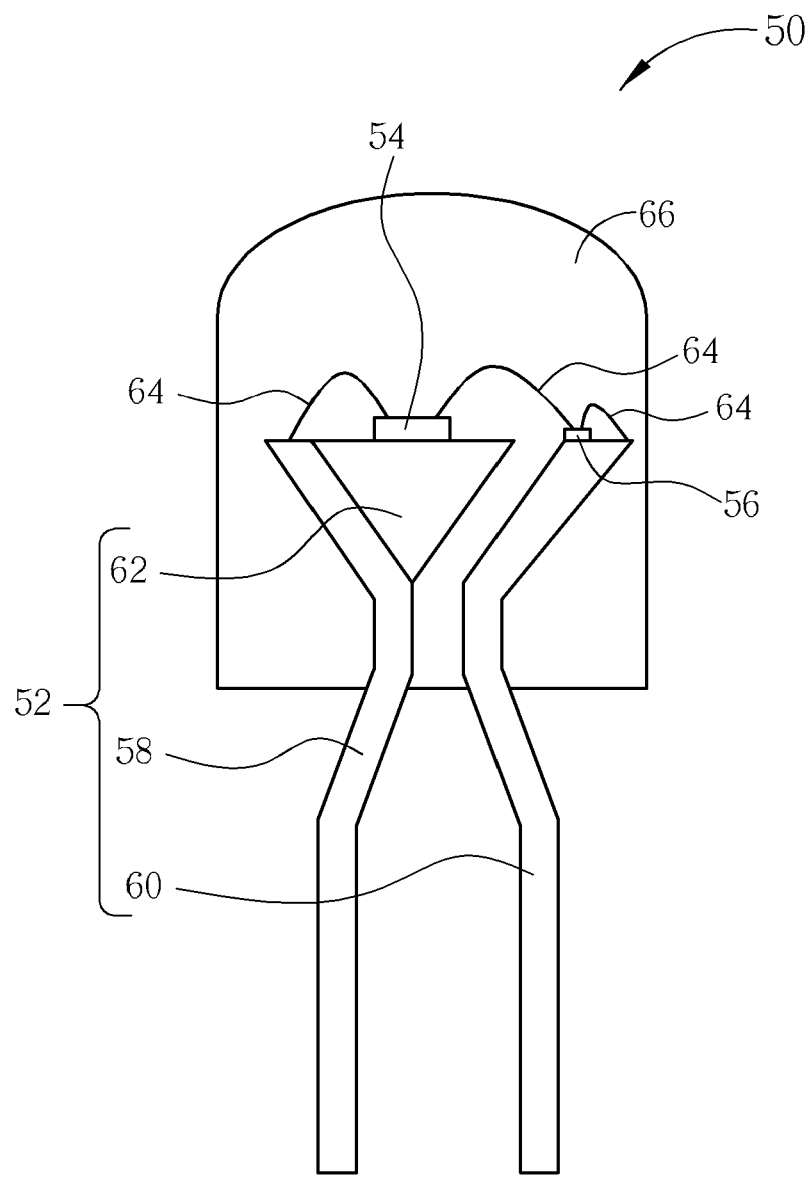
FIG. 1 is a cross-sectional schematic diagram illustrating an LED package structure of a first embodiment of the present disclosure.
Figure 2:
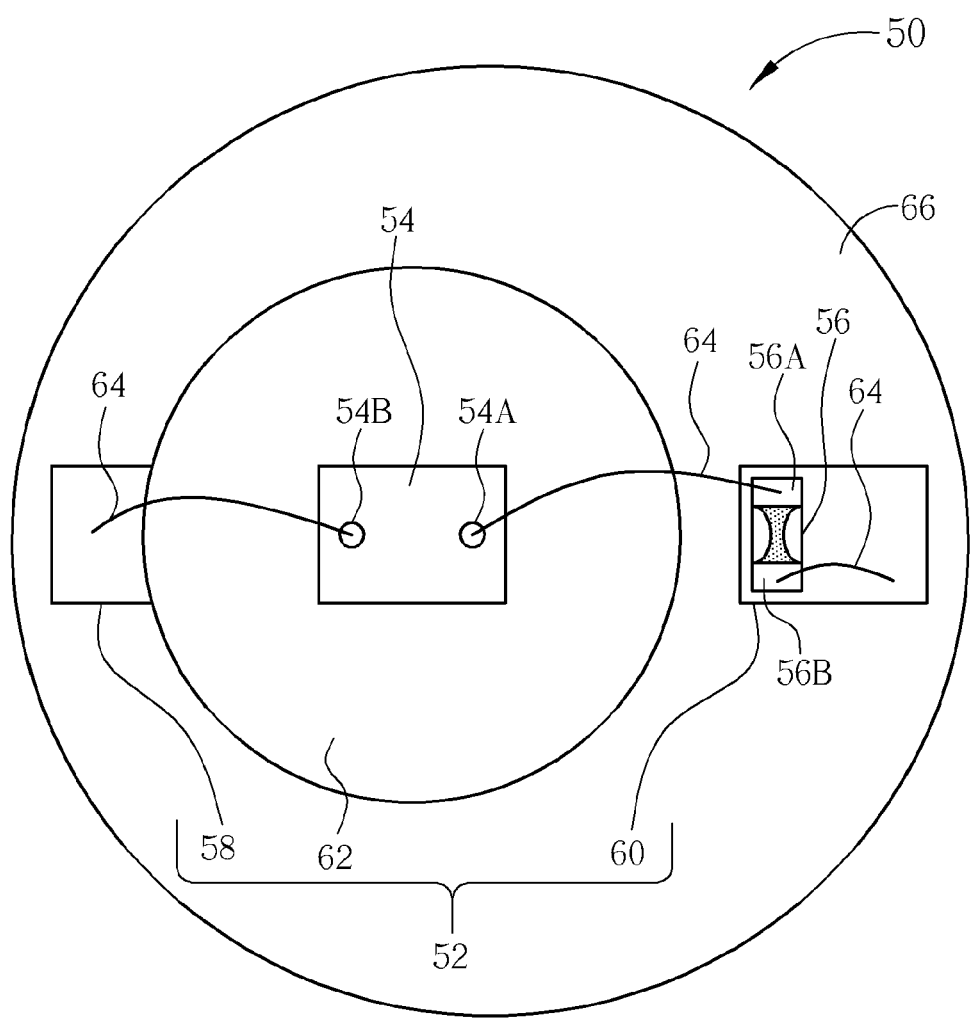
FIG. 2 is a top view schematic diagram illustrating an LED package structure of a first embodiment of the present disclosure.

With reference to FIG. 1 and FIG. 2, FIG. 1 is a cross-sectional schematic diagram illustrating an LED package structure of a first embodiment of the present disclosure, and FIG. 2 is a top-view schematic diagram illustrating an LED package structure of the first embodiment of the present disclosure. As illustrated in FIG. 1 and FIG. 2, the LED package structure 50 includes a lead frame 52, an LED chip 54 and a fuse 56. The lead frame 52 includes a first lead pin 58, a second lead pin 60 and a loading part 62 connected to the first lead pin 58. The LED chip 54 includes a positive electrode 54A and a negative electrode 54B disposed on the loading part 62 of the lead frame 52. In addition, in this embodiment, the fuse 56 is disposed on the second lead pin 60 of the lead frame 52, a first electrode 56A of the fuse 56 is electrically connected to the positive electrode 54A of the LED chip 54, and a second electrode 56B of the fuse 56 is electrically connected to the second lead pin 60 of the lead frame 52.

In addition, as illustrated in FIG. 2, the LED package structure 50 further includes a plurality of metal conductive wires 64 configured to electrically connect the fuse 56, the LED chip 54 and the lead frame 52. The metal conductive wires 64 may be made of gold, but not limited to gold. In this embodiment, by virtue of wire bonding process, the metal conductive wires 64 are configured to electrically connect the positive electrode 54A of the LED chip 54 and the first electrode 56A of the fuse 56, to electrically connect the second electrode 56B of the fuse 56 and the second lead pin 60 of the lead frame 52, and to electrically connect the negative electrode 54B of the LED chip 54 and the first lead pin 58 of the lead frame 52, such that the LED chip 54 and the fuse 56 are electrically connected in series between the first lead pin 58 of the lead frame 52 and the second lead pin 60 of the lead frame 52. However, the circuit connection of the present disclosure is not limited to the aforementioned connection. For instance, the locations of the positive electrode 54A and the negative electrode 54B of the LED chip 54 illustrated in FIG. 2 may be exchanged. That is, in the present disclosure, the metal conductive wires 64 may be used to electrically connect the negative electrode 54B of the LED chip 54 and the first electrode of the fuse 56, to electrically connect the second electrode of the fuse 56 and the first lead pin 58 of the lead frame 52, and to electrically connect the positive electrode 54A of the LED chip 54 and the second lead pin 60 of the lead frame 52.

As illustrated in FIG. 1, the LED package structure 50 further includes an encapsulation 66. The encapsulation 66 covers parts of the first lead pin 58 and the second lead pin 60 of the lead frame 52, the loading part 62 of the lead frame 52, the LED chip 54, the fuse 56 and the metal conductive wires 64 so as to efficiently protect the LED chip 54 and the fuse 56. With the encapsulation 66, the stable electrical connections between the metal conductive wires 64, the LED chip 54, the fuse 56 and the lead frame 52 are enhanced. Accordingly, the malfunction in the LED package structure 50 obviated. The present disclosure is not limited to the aforementioned package structure. For example, the encapsulation 66 may cover only parts of the lead frame 52 and surround the LED chip 54, the fuse 56 and the metal conductive wires 64. In such a case, the components surrounded by the encapsulation 66 are protected from damages due to external force. The material of the encapsulation 66 can be epoxy, silicone and, polyamide, etc.

Figure 3:
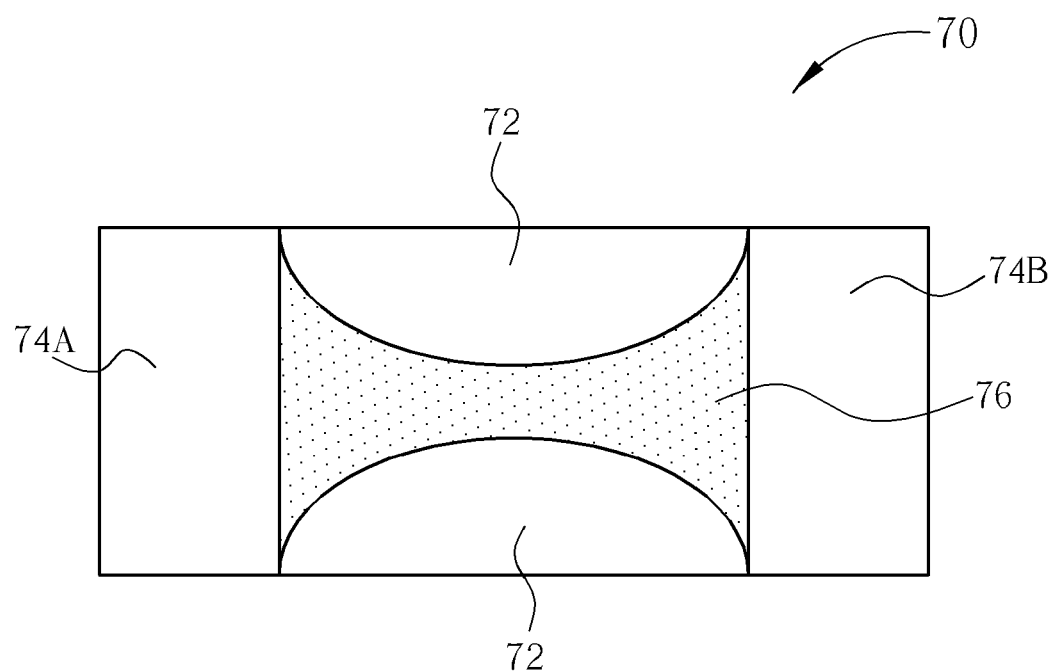
FIG. 3 is a top view schematic diagram illustrating the chip fuse.
Figure 4:
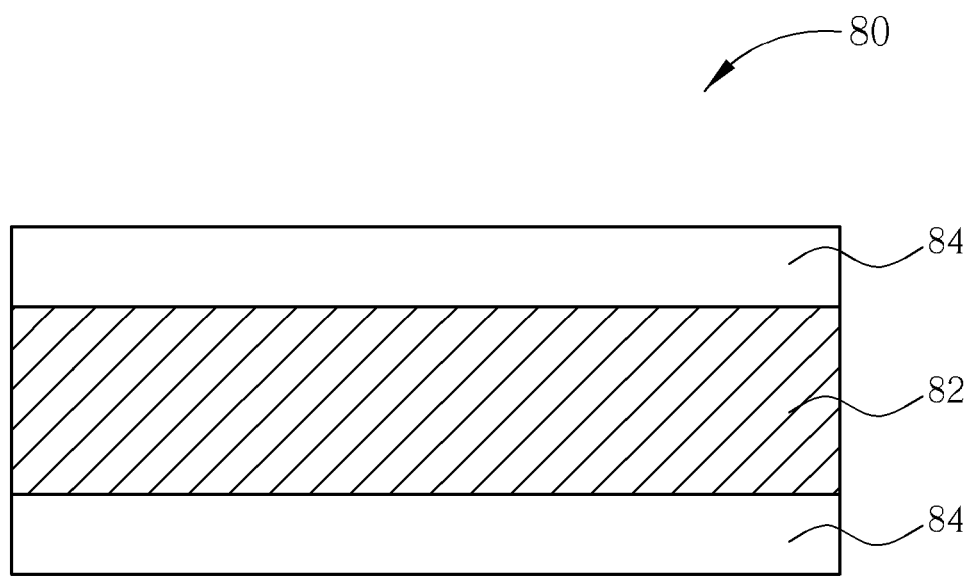
FIG. 4 is a cross-sectional schematic diagram illustrating a resettable fuse.

It should be noted that the fuse 56 is electrically connected to the LED chip 54 in series. Therefore, when a higher current in excess of the current limit threshold is supplied to the circuit system, the internal circuit of the fuse 56 will be melted so as to protect the LED chip 54. In such a connection, damages or burning of the LED chip 54 due to high current may be prevented. In this embodiment, the fuse 56 is preferably, but not limited to, a chip fuse. With reference to FIG. 3, FIG. 3 is a top view schematic diagram illustrating a chip fuse. As illustrated in FIG. 3, the chip fuse 70 includes a substrate 72, a first electrode 74A, a second electrode 74B and a low melting point metal conductive pad 76 disposed on the substrate 72. The first electrode 74A and the second electrode 74B are disposed on the substrate 72, and electrically connected together through the low melting point metal conductive pad 76. The preferred material of the substrate 72 is, but not limited to, silicon. Also, the melting point of the metal conductive pad 76 is substantially low. Thus, when the current provided by the circuit system passes through the metal conductive pad 76, the temperature of the low melting point metal conductive pad 76 will increase. After that, the low melting point metal conductive pad 76 will be melted to form an open circuit. Furthermore, the width of the low melting point metal conductive pad 76 may be adjusted according to required current load. The fuse of the present disclosure is not limited to a chip fuse, and may be a resettable fuse. With reference to FIG. 4, FIG. 4 is a schematic diagram illustrating a cross-sectional structure of the resettable fuse. As illustrated in FIG. 4, the resettable fuse 80 includes a conductive polymer layer 82 and two electrodes 84 disposed on the two sides of the conductive polymer layer 82. When the current exceeds the current load limit of the resettable fuse 80, the temperature of the resettable fuse 80 will increase so as to form polymer chain scission inside the conductive polymer layer 82, such that the conductive polymer layer 82 will transfer from a conductor to a non-conductor. When the temperature falls down, the conductive polymer layer 82 will turn to a conductor again. Consequently, the occurrence of higher current passing through the LED chip 54 can be avoided.

Figure 5:
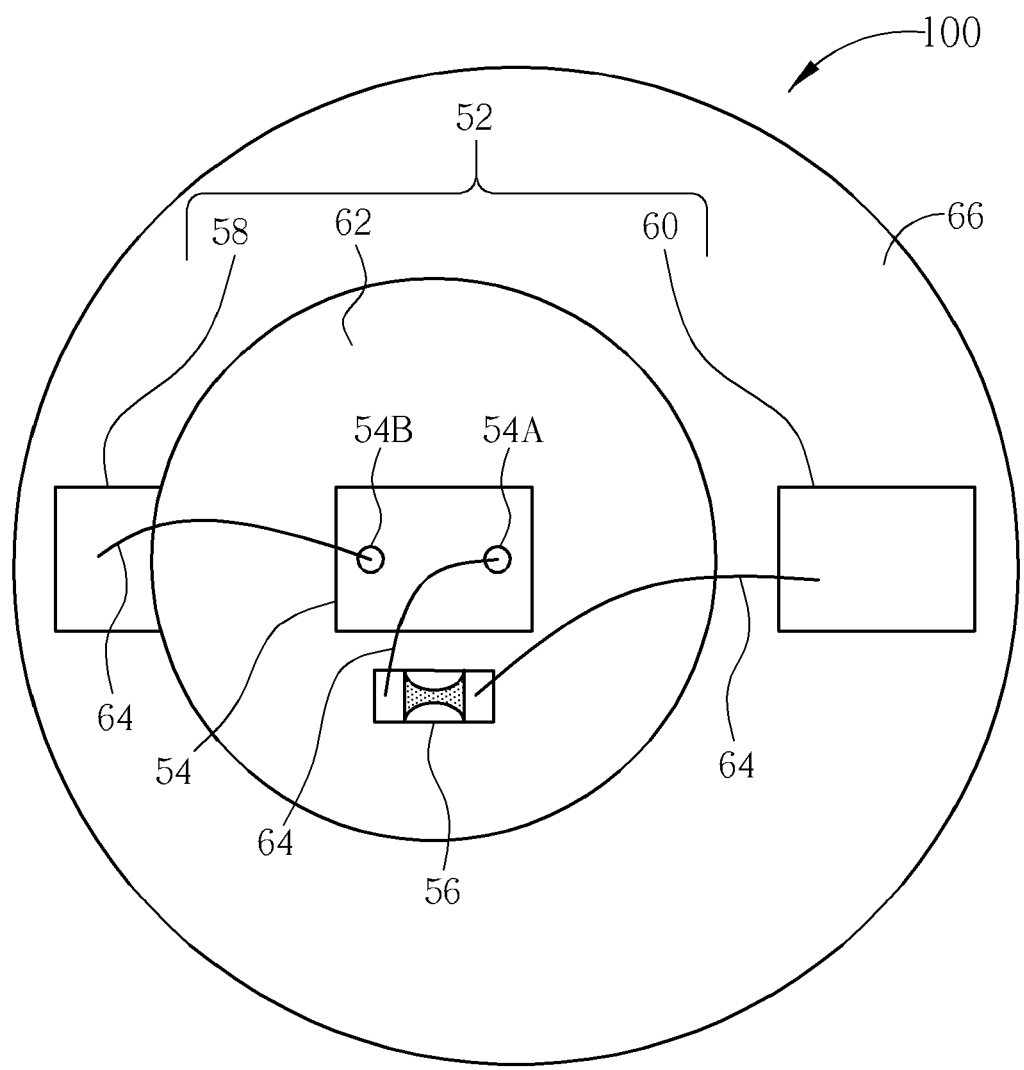
FIG. 5 is a top view schematic diagram illustrating an LED package structure of a second embodiment of the present disclosure.
Figure 6:
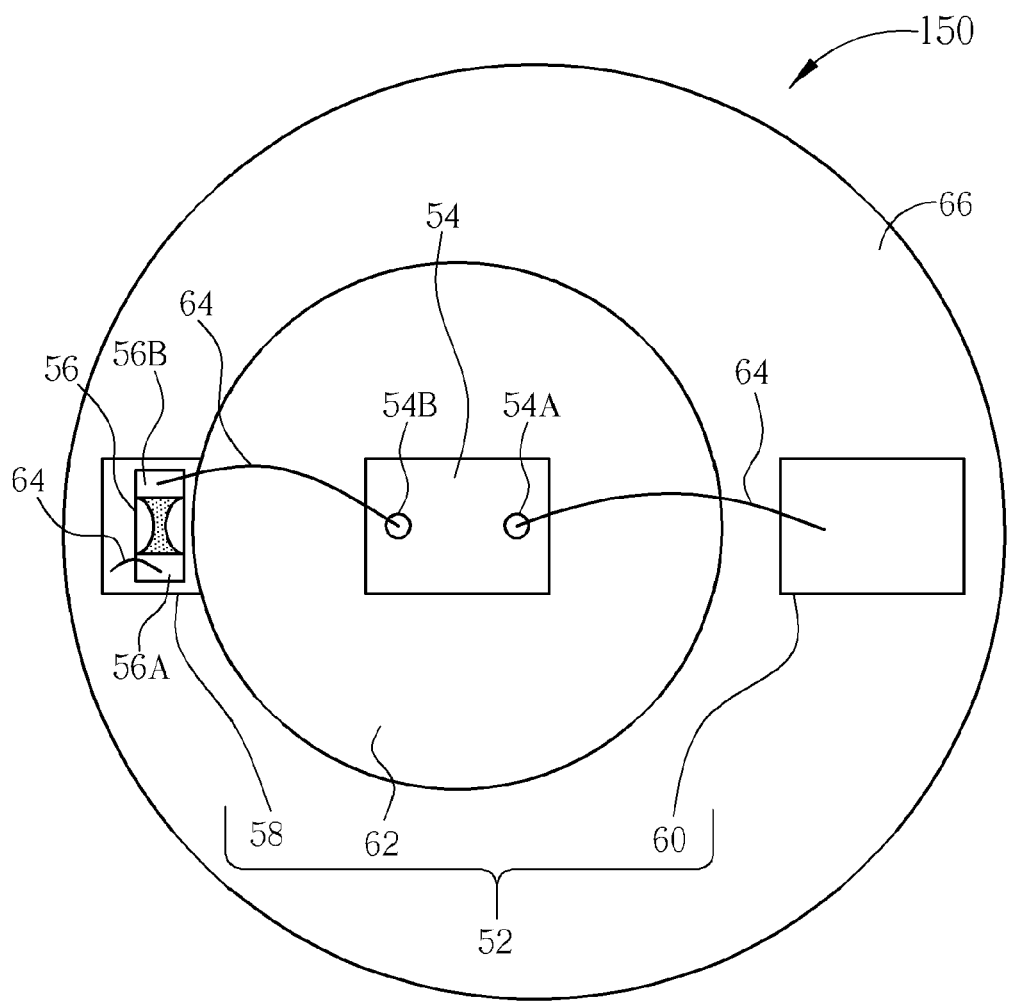
FIG. 6 is a top view schematic diagram illustrating an LED package structure of a third embodiment of the present disclosure.

The location of the fuse of the present disclosure is not limited to the aforementioned embodiment. FIG. 5 is a top view schematic diagram illustrating an LED package structure 100 of a second embodiment of the present disclosure, and FIG. 6 is a top view schematic diagram illustrating an LED package structure 150 of a third embodiment of the present disclosure. Moreover, in order to simplify the description, identical elements denoted by the same numerals indicate the same devices, and redundant description of the structure identical to the first embodiment is no longer detailed. As illustrated in FIG. 5, as compared with the first embodiment, the fuse 56 of the LED chip package structure 100 of the second embodiment is disposed on the loading part 62 of the lead frame 52, the fuse 56 is disposed on one side of the LED chip 54 and is not in contact with the LED chip 54. In addition, as illustrated in FIG. 6, as compared with the first embodiment, the fuse 56 of the LED package structure 150 of the third embodiment is disposed on the first lead pin 58 of the lead frame 52. The first electrode 56A of the fuse 56 is electrically connected to the first pin 58, and the second electrode 56B of the fuse 56 is electrically connected to the positive electrode 54A of the LED chip 54. The negative electrode 54B of the LED chip 54 is electrically connected to the second lead pin 60. The location of the positive electrode 54A and the negative electrode 58B is not limited, and can be exchanged.

In summary, the present disclosure provides an LED package structure with a fuse, wherein the fuse is electrically connected to the LED chip in series. In such a connection, the LED chip and the circuit system electrically connected to the LED chip are free from high current.

Those skilled in the art will readily observe that numerous modifications and alterations of the device and method may be made while retaining the teachings of the present disclosure.

What is claimed is:

1. A light emitting diode (LED) package structure, comprising:
   an LED chip; and
   a fuse electrically connected to the LED chip in series, the fuse alternatively changing between being electrically conductive and being electrically non-conductive depending on a temperature of the fuse; and a lead frame having a first lead pin, a second lead pin, and a loading part connected to the first lead pin; the LED chip is disposed on the loading part of the lead frame, wherein the loading part has a triangular profile when viewed from a side, and wherein the fuse is disposed on the first lead pin of the lead frame.

2. The LED package structure of claim 1, wherein the fuse comprises a resettable fuse.

3. The LED package structure of claim 2, wherein the resettable fuse comprises two electrodes and a conductive polymer layer sandwiched between the two electrodes.

4. The LED package structure of claim 1, further comprising:
   a plurality of metal conductive wires that electrically connect the LED chip and the fuse in series between the first lead pin and the second lead pin of the lead frame.

5. A light emitting diode (LED) package structure, comprising:
   a lead frame having a first lead pin, a second lead pin, and a loading part connected to the first lead pin;
   an LED chip disposed on the lead frame; and
   a fuse disposed on the lead frame and electrically connected to the LED chip in series between the first lead pin and the second lead pin of the lead frame, the fuse alternatively changing between being electrically conductive and being electrically non-conductive depending on a temperature of the fuse; and the LED chip is disposed on the loading part of the lead frame, wherein the loading part has a triangular profile when viewed from a side, and wherein the fuse is disposed on the first lead pin of the lead frame.

6. The LED package structure of claim 5, wherein the fuse comprises a resettable fuse.

7. The LED package structure of claim 6, wherein the resettable fuse comprises two electrodes and a conductive polymer layer sandwiched between the two electrodes.

8. The LED package structure of claim 7, wherein the resettable fuse conducts electrical current at a first temperature, and wherein a polymer chain scission forms in the conductive polymer layer at a second temperature higher than the first temperature such that the resettable fuse transforms from being electrically conductive to electrically non-conductive.

9. The LED package structure of claim 5, further comprising:
   a plurality of metal conductive wires that electrically connect the LED chip and the fuse in series between the first lead pin and the second lead pin of the lead frame.

10. The LED package structure of claim 5, further comprising:
    an encapsulation covering the LED chip, the fuse, and at least a part of the lead frame.

11. The LED package structure of claim 3, wherein the resettable fuse conducts electrical current at a first temperature, and wherein a polymer chain scission forms in the conductive polymer layer at a second temperature higher than the first temperature such that the resettable fuse transforms from being electrically conductive to electrically non-conductive.

12. The LED package structure of claim 1, wherein the fuse changes from being electrically conductive when the fuse is at a first temperature to being electrically non-conductive when the fuse is at a second temperature higher than the first temperature, and further changes from being electrically non-conductive to being electrically conductive when the fuse is cooled down to a temperature lower than the second temperature.

* * * * *